United States Patent
Rubdi et al.

(10) Patent No.: US 6,546,538 B1
(45) Date of Patent: Apr. 8, 2003

(54) INTEGRATED CIRCUIT HAVING ON-CHIP CAPACITORS FOR SUPPLYING POWER TO PORTIONS OF THE CIRCUIT REQUIRING HIGH-TRANSIENT PEAK POWER

(75) Inventors: Shalini Rubdi, San Jose; Stefan Graef, Milpitas; Juergen Lahner, Sunnyvale, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/523,224

(22) Filed: Mar. 10, 2000

(51) Int. Cl.[7] .............................................. G06F 17/50
(52) U.S. Cl. .............................. 716/12; 716/13; 716/14
(58) Field of Search .............................. 716/12, 13, 14, 716/9, 10, 11

(56) References Cited

U.S. PATENT DOCUMENTS

| | | | | |
|---|---|---|---|---|
| 4,378,620 A | * | 4/1983 | Lavene | 29/25.42 |
| 5,207,103 A | * | 5/1993 | Wise et al. | 73/724 |
| 5,949,638 A | * | 9/1999 | Greenwood, Jr. et al. | 361/508 |
| 6,218,729 B1 | * | 4/2001 | Zavrel et al. | 257/698 |
| 6,258,733 B1 | * | 7/2001 | Solayappan et al. | 438/785 |

OTHER PUBLICATIONS

Carastro et al, "Statistical Of Embedded Capacitors Using Meonte Carlo Simulation," IEEE, May 2000, PP. 198–205.*

Huber et al, "A FDTD Method For Fast Simulation Of Decoupling Capacitors On Multilayer Multichip Modules," IEEE, May 1999, PP. 228–231.*

Harada et al, "Radiated Emission Arizing From Power Distribution In Multilayer Printed Circuit Boards," IEEE, Aug. 1997, PP. 518–522.*

* cited by examiner

Primary Examiner—Vuthe Siek
(74) Attorney, Agent, or Firm—Sawyer Law Group LLP

(57) ABSTRACT

Provided is an integrated circuit (IC) device that includes a semiconductor substrate on which electronic components are formed and multiple metal layers on which wires are routed. Formed on the multiple metal layers is a capacitor that includes a first plate formed on a first metal layer and a second plate formed on a second metal layer that is adjacent to the first metal layer. An area in which the first plate and the second plate overlap has a width of at least twice the width of a typical wire on the IC device. Also provided is a technique for supplying power and ground to locations on an integrated circuit (IC) device that has multiple metal layers for routing wires and a substrate for forming electronic components. Initially, the technique identifies an overlap area where two of the multiple metal layers that are adjacent to each other have open space. A plate is then formed in the overlap area of each of the two metal layers so as to construct a capacitor. Then, one plate of the capacitor is connected to power, the other plate of the capacitor is connected to ground, and the plates of the capacitor are also connected to locations on the substrate of the IC device.

13 Claims, 8 Drawing Sheets

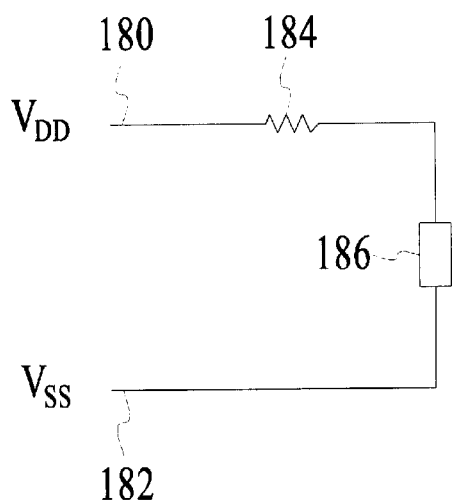
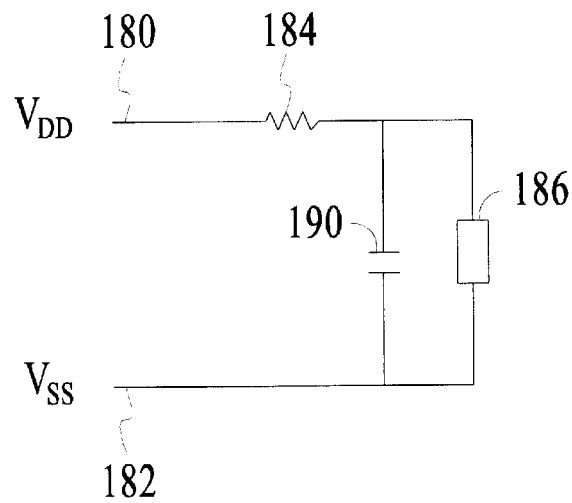
FIG. 8A                FIG. 8B
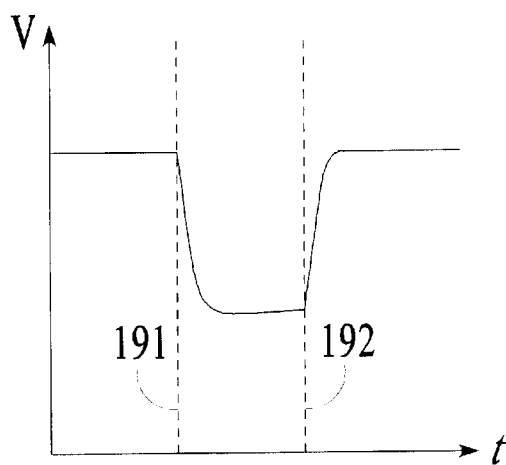
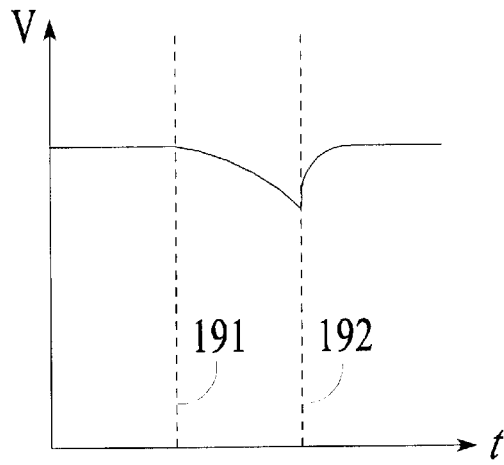
FIG. 9A                FIG. 9B

INTEGRATED CIRCUIT HAVING ON-CHIP CAPACITORS FOR SUPPLYING POWER TO PORTIONS OF THE CIRCUIT REQUIRING HIGH-TRANSIENT PEAK POWER

BACKGROUND OF THE INVENTION

1. Field of the Invention

The present invention relates to an integrated circuit (IC) chip having on-chip capacitors formed in its metal layers, and particularly relates to using such capacitors in connection with routing power and ground to portions of the circuit that require high transient peak power.

2. Description of the Related Art

Today's IC chips require more power than in the past. At the same time, operating frequencies also have significantly increased, thus significantly shortening cycling times. As a result of these developments, it is often necessary to have available a power supply that is capable of delivering high peak power to different portions of the circuit. Unfortunately, the wire resistance between the power and ground input terminals of the IC, on the one hand, and the specific portion of the circuitry to which such power and ground is being delivered, on the other, often severely limits the peak power that can be delivered to that portion of the circuit.

One possible solution to this problem is to attempt to place those portions of the circuitry that require relatively high peak power close to the power and ground input terminals. In a standard IC, this requires placing those portions of the circuitry close to the periphery of the IC and, more specifically, close to the power and ground terminals on the periphery. Unfortunately, such space is limited. Thus, when there are many different portions of the circuitry that require high peak power, this solution often is unacceptable.

A related solution is to use a flip-chip IC package. In a flip-chip package, the input/output (I/O) terminals for the chip are located across the entire surface of the chip, rather than just at the periphery. As a result, by including multiple power and ground terminals dispersed across the surface of the IC, the routing distance between the power and ground input terminals and the desired portion of the circuitry often can be significantly shortened. Unfortunately, flip-chip fabrication usually is more expensive than standard chip fabrication. Therefore, this solution also has limited applicability.

Thus, what has been long needed is a technique for delivering high peak power to portions of a circuit where it is needed that can be implemented in a standard IC chip package.

SUMMARY OF THE INVENTION

The present invention addresses the foregoing need by utilizing unused portions of the chip's metal layers to form capacitors that can function as power cells.

Thus, in one aspect the invention is directed to supplying power and ground to locations on an integrated circuit (IC) device that has multiple metal layers for routing wires and a substrate for forming electronic components. Initially, the technique according to this aspect of the invention identifies an overlap area where two of the multiple metal layers that are adjacent to each other have open space. It is noted that this overlapping open space may have occurred by happenstance or may have been intentionally designed into the chip during the routing phase of the IC design so as to occur near a portion of the circuit that requires high peak power. A plate is then formed in the overlap area of each of the two metal layers so as to construct a capacitor. Generally, the plates of the capacitor are formed so as to occupy substantially all of the overlap area. Then, one plate of the capacitor is connected to power, the other plate of the capacitor is connected to ground, and the plates of the capacitor are also connected to locations on the substrate of the IC device.

By forming a capacitor in an IC's metal layers in the foregoing manner, the present invention often can supply more transient peak power to a portion of the circuit than would have been possible with conventional designs. Moreover, because it is common to have a significant amount of unused space in an IC's metal layers, such a capacitor often can be included at little additional cost. By including multiple such capacitors, the present invention often can fully accommodate the transient peak power requirements of each portion of the IC, again without significant additional cost.

In a further aspect, the invention is directed to an integrated circuit (IC) device that includes a semiconductor substrate on which electronic components are formed and multiple metal layers on which wires are routed. Formed on the multiple metal layers is a capacitor that includes a first plate formed on a first metal layer and a second plate formed on a second metal layer that is adjacent to the first metal layer. According to this aspect of the invention, an area in which the first plate and the second plate overlap has a width of at least twice the width of a typical wire on the IC device.

This configuration can permit capacitors of 10 femtofarads or more to be included within the IC, at little additional cost. By utilizing such capacitors as power cells (e.g., by connecting one plate to power and the other to ground and then connecting both to an area of the substrate where high transient peak power is required), this configuration can frequently deliver much higher transient peak power than conventional designs would permit.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 8A is an electrical schematic illustrating conventional routing of power and ground.

FIG. 8B is an electrical schematic illustrating routing of power and ground according to the present invention.

FIG. 9A illustrates the change in voltage across a cell during a period of transient peak power requirement when using conventional routing of power and ground.

FIG. 9B illustrates the change in voltage across a cell during a period of transient peak power requirement when routing power and ground according to a representative embodiment of the present invention.

DESCRIPTION OF THE PREFERRED EMBODIMENT(S)

Generally speaking, the present invention utilizes the metal layers of an integrated circuit (IC) device for forming capacitors. Specifically, the plates of each capacitor are formed in open spaces (i.e., no routing) of adjacent metal layers. In a preferred embodiment of the invention, these capacitors are used as power cells and preferably are placed close to portions of the circuit that require high transient peak power.

Methods for Forming Capacitors

Figure 1A:
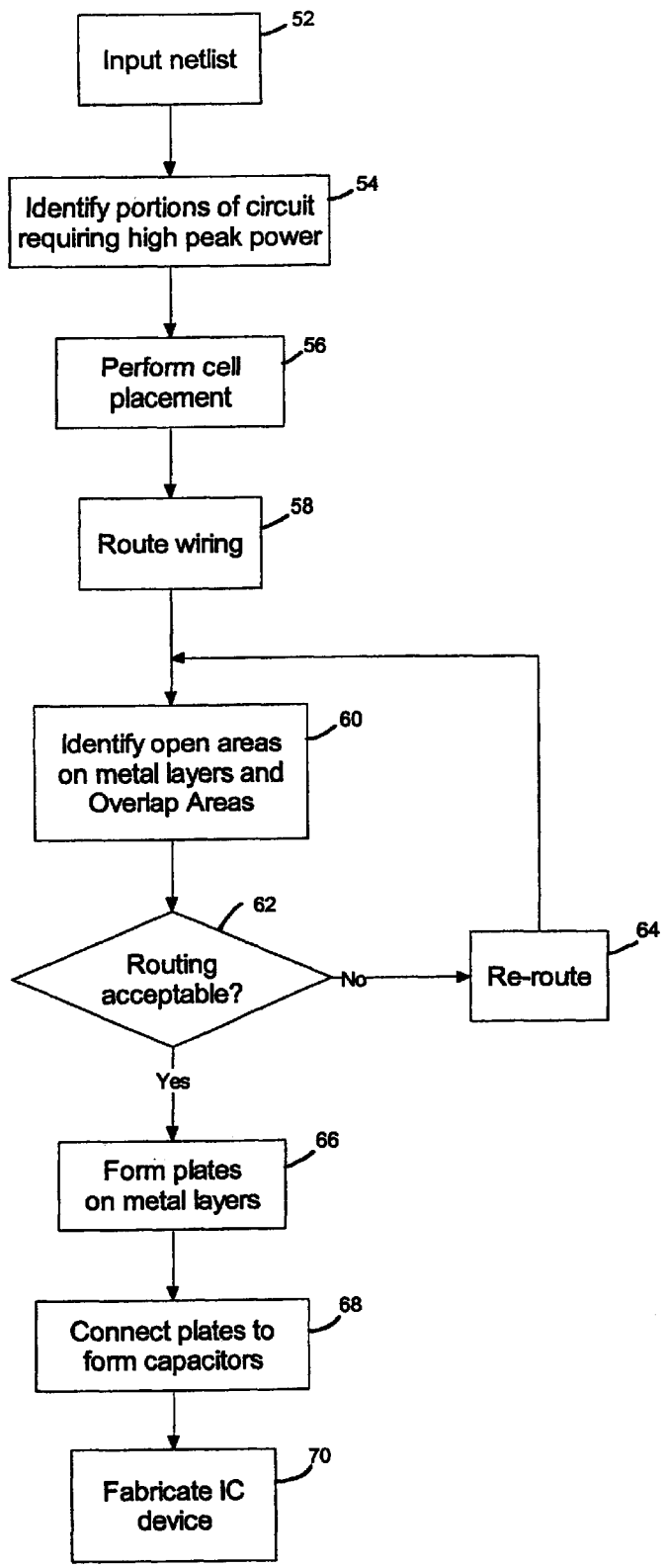
FIGS. 1A and 1B are flow diagrams illustrating a portion of the design of an integrated circuit having on-chip capacitors according to representative embodiments of the invention.

FIG. 1A illustrates a flow diagram for explaining methods of forming on-chip capacitors according to certain representative embodiments of the invention. Briefly, according to FIG. 1A, a netlist is input; portions of the circuit requiring high transient peak power are identified; cell placement is performed; wire routing is performed; open areas on the metal layers are identified; a determination is made as to whether the routing is acceptable; if not, re-routing is performed, open areas are again identified, and another determination is made whether routing is acceptable; once routing is determined to be acceptable, plates are formed in open areas on the metal layers; and, finally, the plates are connected so that plates on adjacent metal layers form capacitors. Preferably, the capacitors are connected in parallel between power and ground on the one hand and a portion of the circuit requiring high transient peak power on the other. More preferably, the capacitors are formed as close as possible to the portions of the circuit requiring high transient peak power.

In more detail, in step 52 a netlist is input. Typically, the netlist will have been generated by the synthesis step of integrated circuit design. As is well understood in the art, synthesis generally involves the process of converting a behavioral level description of a circuit into a circuit schematic that specifies actual cells (e.g., gates and flip-flops) and electrical interconnections between those cells.

In step 54, portions of the circuit requiring high transient peak power are identified. Typically, this step will be performed in connection with a simulation of the circuit specified by the input netlist. Circuit simulations based on an input netlist are well known in the art and are typically used to generate timing, power, drive strength and various other estimates for verifying the feasibility of the circuit. According to the preferred embodiment of the present invention, during such circuit simulation both steady state power requirements and transient peak power requirements are determined for each portion of the circuit. While both of these parameters will be used in designing the physical layout of the integrated circuit, the present invention is primarily directed to satisfying the transient peak power requirements and relies on other IC design techniques to satisfy the steady state power requirements.

Typically, the following factors will be taken into account in determining transient peak power requirements: number of gates to be supplied, the peak power and average power consumption for each gate, clock frequency, gate switching activity, area (floor plan), chip utilization, clock information (local clock buffer supply needs), and available power rails.

Due to the very nature of digital circuits, in which components typically switch on and off at discrete time intervals, the term "steady state power requirement" may be somewhat of a misnomer. However, that term should be understood to mean the amount of the power ordinarily required by the subject portion of the circuit (e.g., more than 50 percent, 70 percent or 90 percent of the time). As previously noted, the present invention mainly is directed to supplying the transient peak power requirements for portions of circuitry. If a peak power requirement instead is required over relatively longer periods of time, then that peak power requirement should be treated as a steady state power requirement and satisfied accordingly. In fact, by making available sufficiently high steady state power, the need to provide a separate transient peak power capability often can be obviated entirely. Although this is the approach taken in many conventional techniques, such a technique often will not make the most efficient use of the available resources.

On the other hand, by separately addressing the steady state and transient peak power requirements of each portion of circuitry, the present invention often can achieve significant efficiencies. Moreover, these efficiencies often can be obtained at little additional cost in the present invention because the capacitors for satisfying he transient peak power requirements can frequently be formed on otherwise unused portions of the metal layers.

In the current embodiment of the invention, identification of high transient peak power requirements is performed based on a simulation of an input netlist. However, it is noted that the step of identifying portions of the circuit requiring high transient peak power may instead be performed based on a simulation of a behavioral level description of the circuit (i.e., earlier in the design process) and/or after cell placement or routing (i.e., later in the design process). Such information may even be updated at each such step of the design process.

In step 56, the cells identified in the netlist are placed on the surface of the integrated circuit. Numerous techniques exist for performing this step of integrated circuit design and, accordingly, this step is not described in significant detail here. However, it is noted that one concern in performing cell placement often is to place cells requiring high steady state power close to the IC's input terminals for power and ground. In this manner, power loss due routing often can be significantly reduced.

In step 58, wire routing is performed. Specifically, the cells placed in step 56 now need to be interconnected according to the netlist specification input in step 52. It is noted that an absolutely optimal routing solution generally will be NP-complete, meaning that such a solution will not be capable of determination in polynomial time. Accordingly, many techniques exist for identifying a near-optimal routing solution. These techniques are typically primarily heuristically based and, for example, often attempt to minimize total routing length, routing length on critical nets, and/or various other criteria.

In the preferred embodiment of the present invention, wire routing preferably also takes into account the portions of the circuit requiring high transient peak power identified in step 54. Specifically, the routing process of the present invention preferably attempts to avoid routing (i.e., leave open spaces) on two adjacent metal layers in the spaces near such portions of the circuit so that capacitors can be placed in those spaces. This goal can be accomplished in a number of different ways.

For example, it is possible to specify a particular space near a (or each) portion of the circuit where high transient peak power is required and then simply ban routing within that space on two specified adjacent metal layers. Unfortunately, this technique may in many cases turn out to be too inflexible to accommodate the other goals of the routing process. Accordingly, another technique is to weight against routing in the vicinity of a (or each) portion of circuitry that requires high transient peak power. Specifically, it is common in routing techniques to employ cost functions that result in an overall penalty for any given routing configuration. In these techniques, the router attempts to find the routing configuration that results in the minimum or near minimum penalty. Accordingly, such techniques can be relatively easily modified to accommodate the present goal by simply introducing additional cost functions that weight against routing in the vicinity of portions of the circuit that require high transient peak power.

These additional cost functions may be implemented as penalties for routing on either of two specified adjacent metal layers. Alternatively, such additional cost functions may be specified in an attempt to create an overlapping open space on any two adjacent metal layers ("Overlap Area") in the vicinity of the portion of the circuit requiring high transient peak power. In this latter case, for examples, the overall penalty may increase for routing in a particular open area of metal layer x or in the open area of a metal layer adjacent to metal layer x; however, no increase in penalty would be caused by routing in an open area of metal layer y if there were no open areas in any metal layer that is adjacent to metal layer y. In either case, it generally will be preferable to increase the penalty for routing through the middle of an Overlap Area as compared with routing along the edge of an Overlap Area (e.g., increase the cost for routing within an Overlap Area in proportion to the distance to the edge of the Overlap Area). The precise form of these additional cost functions generally will be determined empirically.

Also, it is possible to completely ignore the portions of the circuit that require high transient peak power in the initial pass of wire routing. In this case, as noted below, it is possible to simply implement capacitors in whatever overlapping areas in adjacent metal layers happen to exist after completion of routing. Alternatively, if the circuitry portions requiring high transient peak power are initially ignored in the first pass of routing, it is possible to simply attempt to open up such areas during routing modification in step 64 (described below).

In step 60, open areas on the metal layers are identified, i.e., areas where no routing is present. In addition, this step attempts to identify overlapping open areas on adjacent metal layers (i.e., Overlap Areas). Such Overlap Areas are where capacitors can be formed. This step may be implemented, for example, by (1) finding, on each metal layer, each largest possible rectangle (or each largest possible rectangle that is larger than some predetermined size) that does not include any routing; and then (2) identifying the areas where those rectangles overlap on adjacent metal layers. Alternatively, rather than using simple rectangles, it is possible to use any other shapes, such as arbitrary polygons. Still further, it is possible to initially divide the area into non-overlapping rectangles, then identify rectangular areas of overlap for adjacent metal layers, and finally merge contiguous rectangles of overlapping areas to form polygonal areas of overlap.

In step 62, a determination is made as to whether the routing that has been completed is acceptable. For example, one criterion for determining acceptability may be whether all cells required to be interconnected have in fact been appropriately interconnected. Another criterion may be whether signal delays are within specified margins. Another criterion may be whether steady state power supplied to each portion of the IC is sufficient to meet the steady state power requirement to meet that portion of the IC. Another criterion according to the preferred embodiment of the invention is whether the peak power that can be delivered to each portion of the circuit is sufficient to meet the transient peak power requirement of that portion.

In this regard, it can be assumed that capacitors will be formed in the Overlap Areas identified in step 60. Assuming that such capacitors have been placed and appropriately connected, using known circuit analysis techniques a determination can be made as to whether the combination of the power/ground to each specified portion of the circuit, together with the capacitance provided by the anticipated capacitors (acting as power cells) will be sufficient to meet the transient peak power requirements of that portion of the circuit.

Preferably, each of the foregoing criteria is evaluated by simulating the response of the IC to a number of input test vectors and then analyzing the output vectors. If all criteria have been satisfied, then the routing is deemed to be acceptable and processing proceeds to step 66. Otherwise, processing proceeds to step 64.

In step 64, the IC is re-routed in an attempt to correct the deficiencies identified in step 62. This re-routing may take the form of simply modifying the existing routing in an attempt to correct specific problems. Alternatively, large portions or even all of the existing routing may be ripped up and re-routed from scratch. As an example of the former, assume that step 62 identified a failure to meet the transient peak power requirements of a certain portion of the circuit. In this case, it may be possible to shift a relatively small portion of the existing routing so as to enlarge (or create new) overlapping open areas on two adjacent metal layers, thereby providing space for forming a larger (or a new) power cell. If all problems identified in step 62 can be resolved in this manner, significant re-routing may not be required. Upon completion of step 64, processing returns to step 60 in order to evaluate the effects of the changes made in this step 64.

In step 66, metal plates are formed on the IC's metal layers in the identified Overlap Areas of such metal layers, with each such plate preferably occupying all or substantially all of its corresponding Overlap Area. However, generally it will be preferable to simply place metal in all open areas of each metal layer.

In step 68, pairs of overlapping metal plates formed in step 66 on adjacent metal layers are electrically connected into the circuit so as to form capacitors. In the preferred embodiment of the invention, these capacitors are intended for use as power cells to provide the transient peak power requirements for the different portions of the circuit. Thus, one plate of each capacitor generally will be connected to power and the other plate to ground. Then, the plates are also connected to a portion of the circuit that requires high transient peak power. Preferably, this portion of the circuit will be located as close to the capacitor as possible, with this goal having been facilitated by routing to create corresponding Overlap Areas in steps 58 and 64.

It is noted that, in the event that in step 66 metal was simply deposited in all open areas of each metal layer, some portions of each plate for any given capacitor might not overlap the other plate of the capacitor. While these non-overlapping portions will be largely irrelevant to the capacitor, with substantially all of the capacitance being determined by the overlapping portions, they may help to satisfy fabrication constraints.

Also, connecting the plates in this step might require modifying the plates somewhat. For example, if a plate was formed too close to a wire to permit insertion of a via, the size of the plate may have to be reduced in the area where the via was required. Similarly, if it is desired to create a via from the top plate directly down to a connection pin, a small hole may have to be formed in the bottom plate to permit formation of such a via. In step 70, the device is fabricated using the cell placement, wire routing and capacitor plate information developed above. Specifically, the preceding steps were directed toward design of the IC. In this step, the chip is actually fabricated based on this physical design information using any of the known fabrication techniques.

Figure 1B:
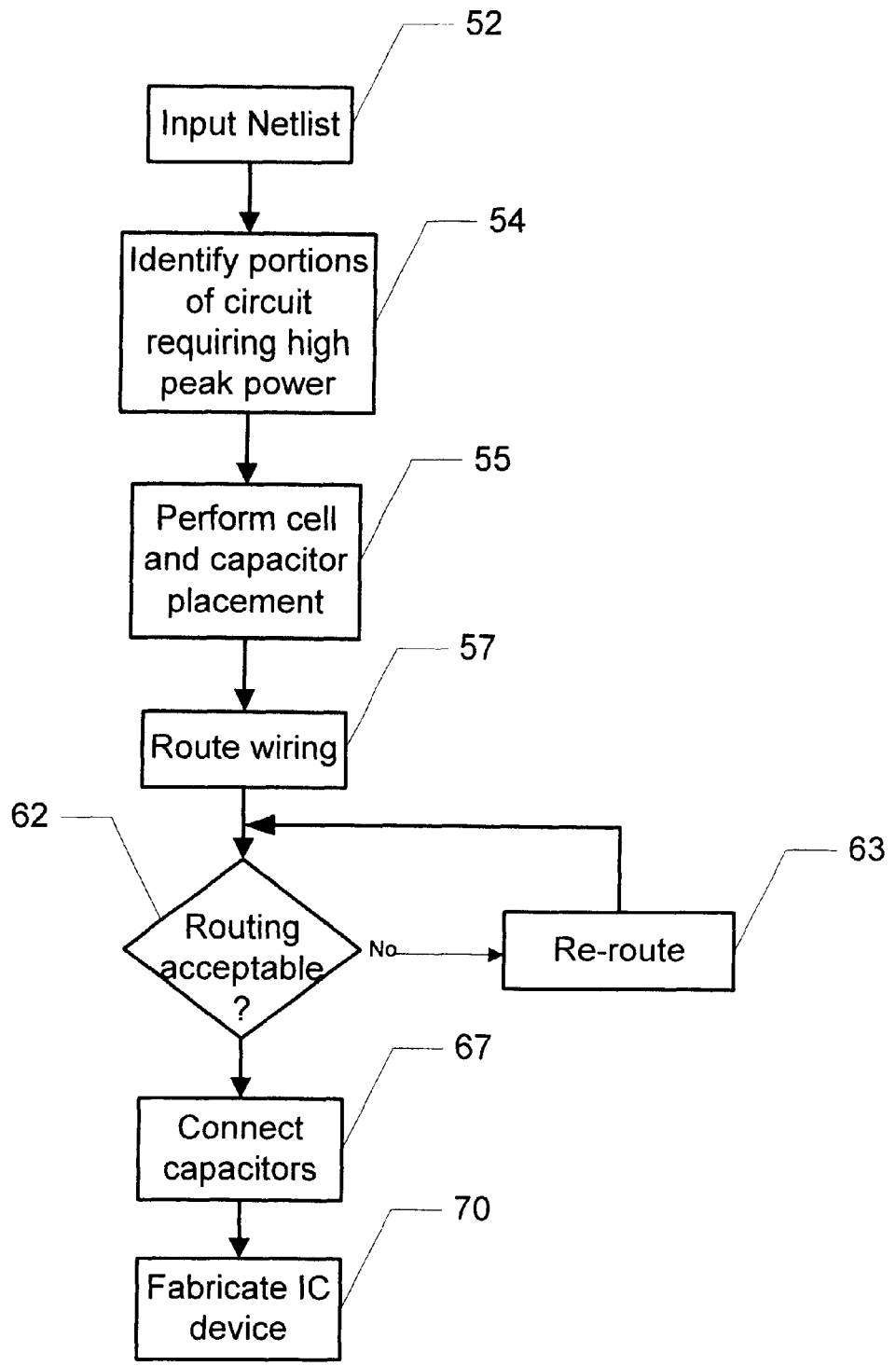

FIG. 1B illustrates an alternative embodiment for forming capacitors on integrated circuits according to the present invention. Essentially, the method illustrated in FIG. 1B differs from that illustrated in FIG. 1A in that the method illustrated in FIG. 1B places capacitors primarily during the cell placement step of IC design, rather than during or after the routing step.

In more detail, in step 52 the netlist is input, as described in detail above.

In step 54, portions of the circuit requiring high transient peak power are identified, as described in detail above. In addition, or alternatively, this step may identify any other portions of the circuit where a capacitor is required.

In step 55, cells and capacitors are placed on the IC. The cell placement portion of this step is described in detail in connection with the discussion of step 56 above. Once the cells have been placed, the geographic areas on the chip requiring high transient peak power (or otherwise requiring a capacitor) can be identified based on the information obtained in step 54. Capacitors are then placed in the IC's metal layers in or near those areas. Preferably, such capacitors are sized so as to accommodate the anticipated transient peak power of the nearby portions of the circuit.

In step 57, wire routing is performed. This step can be performed using any known wire routing techniques. However, routing preferably is blocked in those areas of the metal layers in which capacitors have been specified in step 55.

In step 62, a determination is made as to whether the routing is acceptable, as described in detail above. If so, processing proceeds to step 67, otherwise, processing proceeds to step 63.

In step 63, the routing is modified to correct any deficiencies discovered in step 62. Optionally, such re-routing can include moving the capacitors placed in the IC's metal layers if necessary to satisfy the routing criteria. Preferably, such moving of the on-chip capacitors is limited to only slight movements. Upon completion of re-routing in step 63, processing returns to step 62 to evaluate the new routing.

In step 67, the capacitors in the IC's metal layers are connected into the circuit. As noted above, such capacitors preferably are used as power cells. Accordingly, one plate of each such power cell will be connected to ground and the other to power. This step is similar to step 68 described above.

In step 70, the IC is fabricated using the design information specified in the preceding steps, as described in detail above.

Resulting Capacitor

Figure 2:
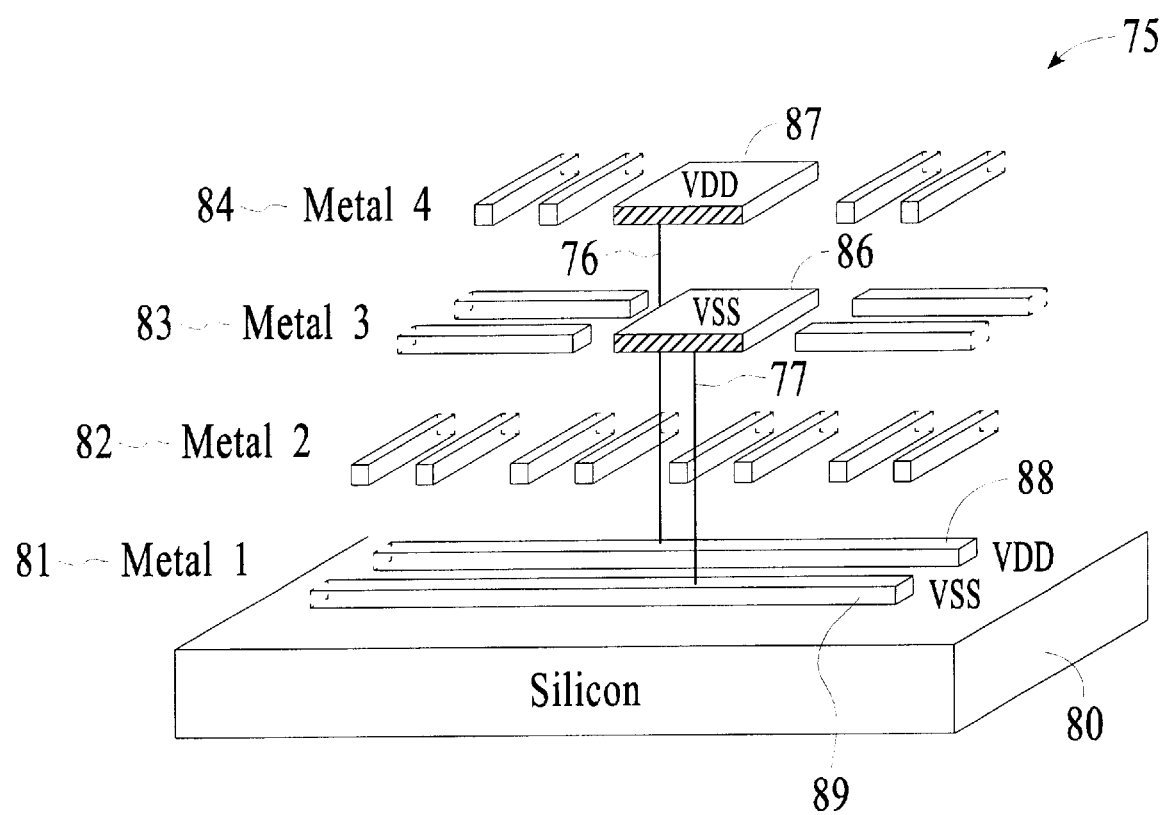
FIG. 2 is a three-dimensional illustration of a portion of an integrated circuit having a power cell according to a representative embodiment of the invention.

FIG. 2 illustrates a portion of an IC 75 that includes a capacitor, such as may have been constructed according to the method described above and illustrated in FIG. 1. As shown in FIG. 2, IC 75 includes a substrate 80 and four metal layers 81 to 84. The first metal layer 81 is used for routing power and ground (the power grid), and the second through fourth metal layers 82 to 84 are used for routing signals between components. Specifically, the second metal layer 82 and the fourth metal layer 84 are used primarily for vertical wire segments, while the third metal layer 83 is used primarily for horizontal wire segments. Formed in the third and fourth metal layers 83 and 84, respectively, is a capacitor that includes plates 86 and 87. Plate 87 is connected using a via 76 to $V_{DD}$ line 88 and plate 86 is connected using a via 77 to $V_{SS}$ line 89. In FIG. 2 the via 76 from plate 87 to $V_{DD}$ line 88 is formed so as to not intersect plate 86. However, via 76 might instead pass through plate 86 by including a small hole in plate 86.

Figure 3:
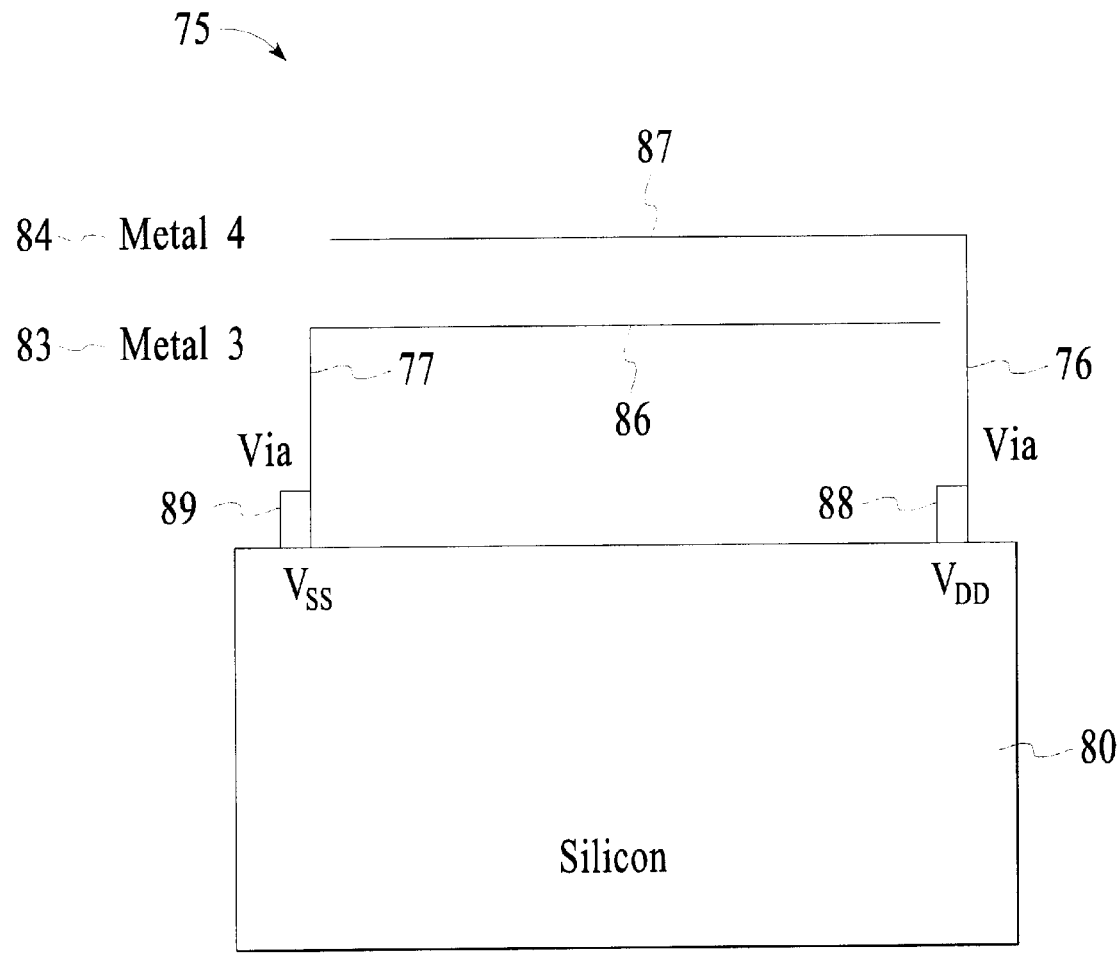
FIG. 3 is a cross-sectional view of a portion of an integrated circuit having a power cell according to a representative embodiment of the invention.

FIG. 3 illustrates a cross-sectional view of the portion of the IC shown in FIG. 2. Although not shown in FIGS. 2 and 3, plates 86 and 87 also are connected to one or more cells on substrate 80 using vias and/or wire segments.

Sample Integrated Circuit

Figure 4:
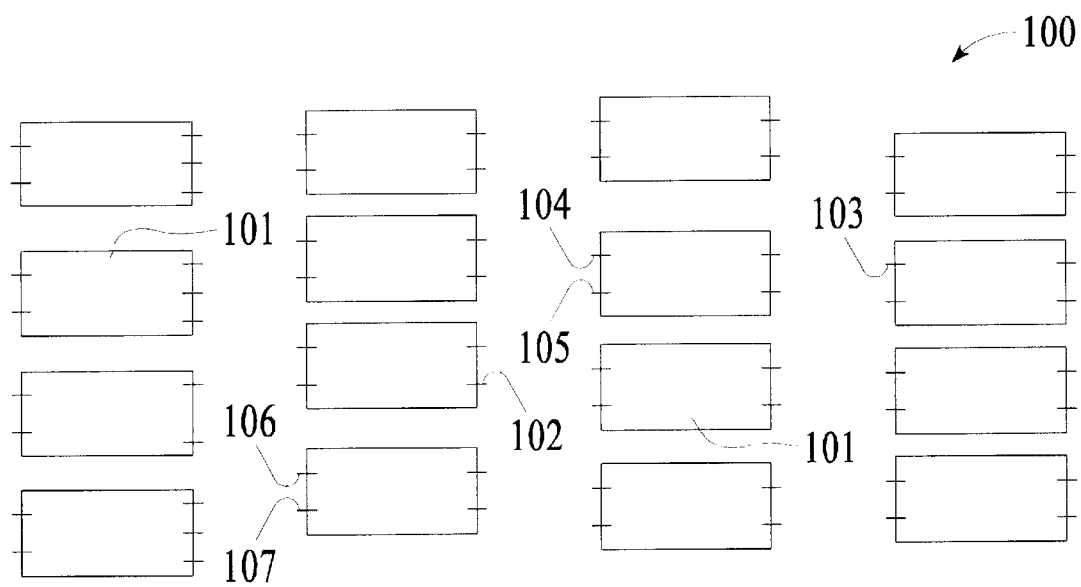
FIG. 4 is a top view of a portion of an integrated circuit cell placement layout.

An example of applying the method of FIG. 1A will now be discussed with reference to FIGS. 4 through 7. FIG. 4 illustrates cell placement in a sample integrated circuit 100. As shown in FIG. 4, IC 100 includes various cells 101 arranged in cell columns. Each cell 101 includes input/output (I/O) pins, such as pins 102 to 107. Of these pins, it is assumed that pins 104 and 106 are power input pins and pins 105 and 107 are ground input pins requiring high transient peak power.

Figure 5:
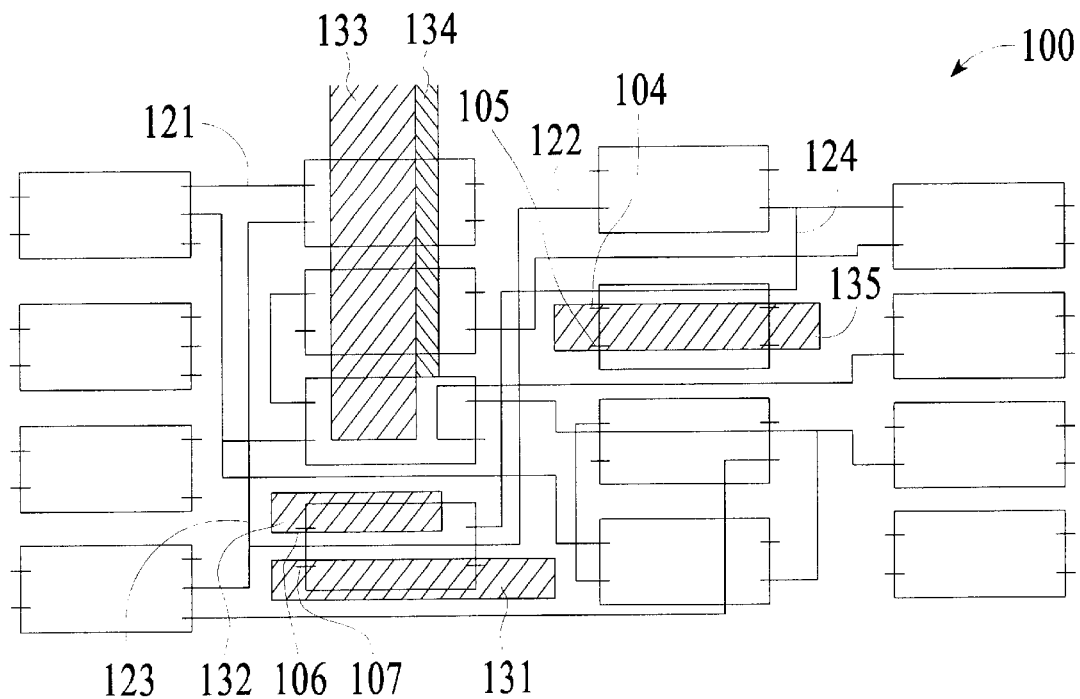
FIG. 5 is a top view of a portion of an integrated circuit layout after an initial routing has been completed.

FIG. 5 illustrates the cell layout after an initial pass of routing has been 15 completed. Thus, in FIG. 5, wire segments, such as segments 121 through 124 connect the pins of the cells as specified by an input netlist. These wire segments include both horizontal segments, such as segments 121 and 122, and vertical segments such as segments 123 and 124. Although not shown in FIG. 5, it should be understood that the vertical segments typically will be routed on a different metal 20 layer than the horizontal segments. That is, each metal layer typically is designated as primarily or exclusively horizontal or primarily or exclusively vertical.

In the present example, it is assumed that the first metal layer consists primarily of vertical wire segments and the second metal layer consists primarily of horizontal wire segments. It is also assumed that the third metal layer is used exclusively for routing the power grid (i.e., including power and ground wires) and that no further metal layers are provided. In this example, the metal layers are numbered according to distance from the semiconductor substrate with the first metal layer being closest to the substrate.

In view of the foregoing assumptions, only two metal layers are provided for routing signals between the different cells, one for vertical wires and one for horizontal wires. Thus, each vertical wire shown in FIG. 5 is routed on the first metal layer 81 and each horizontal wire shown in FIG. 5 is routed in the second metal layer 82.

In this case, it is relatively easy to find the open areas on each metal layer, as well as the places which those open areas overlap on adjacent metal layers. Because only two metal layers are used for signal routing, each Overlap Area can be determined to be a potential site for formation of a capacitor. For example, by simply expanding rectangles into such open areas, we can identify Overlap Areas such as areas 131 to 135. As shown in FIG. 3, a small border is provided around each of areas 131 to 135 in order to allow for fabrication process tolerances.

After the initial routing pass, the routing is evaluated to determine whether all criteria have been satisfied. In the present example, it is assumed that all pins have been appropriately connected and all timing constraints satisfied. However, it is assumed that only Overlap Areas 131 and 132 are available for supplying the transient peak power needs of pins 106 and 107, and that only Overlap Area 135 is available for supplying the transient peak power needs of pins 104 and 105. It is further assumed that the combination of capacitors placed at areas 131 and 132 would be insufficient to supply the required transient peak power to pins 106 and 107, and that a capacitor placed at area 135 would be insufficient to supply the required transient peak power for pins 104 and 105. In this case, routing preferably is adjusted so that the available Overlap Areas for each of these pin pairs is sufficiently large to accommodate a capacitor that can supply the requisite transient peak power.

Figure 6:
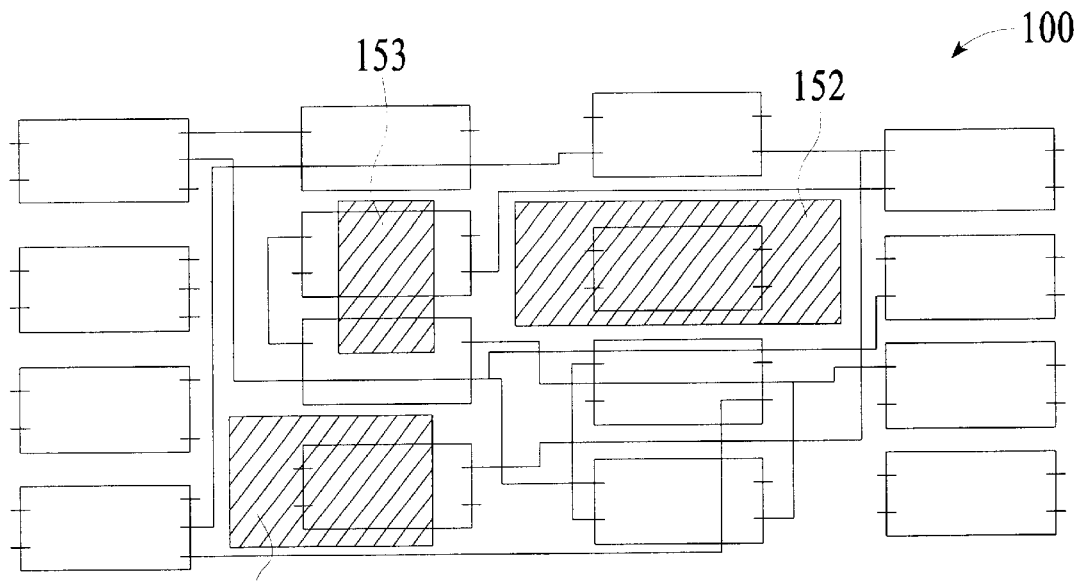
FIG. 6 is a top view of a portion of an integrated circuit layout after modification of routing according to a representative embodiment of the invention.

By appropriately moving wires as shown in FIG. 6, larger Overlap Areas 151 and 152 are made available. It is noted that these enlarged areas have been obtained by simply re-routing a couple of wires. However, the effects of doing so may have altered the sizes of other available Overlap Areas and/or may have changed other timing or other requirements for the circuit. Accordingly, the circuit is re-evaluated in order to verify that all criteria are now satisfied. Once such verification has been made, plates can be formed in Overlap Areas 151 through 153, as well as any other open areas in the metal layers. Thereafter, the capacitors can be connected to power and ground (such as shown in FIGS. 2 and 3) and to the designated portions of circuit requiring high transient peak power.

Figure 7:
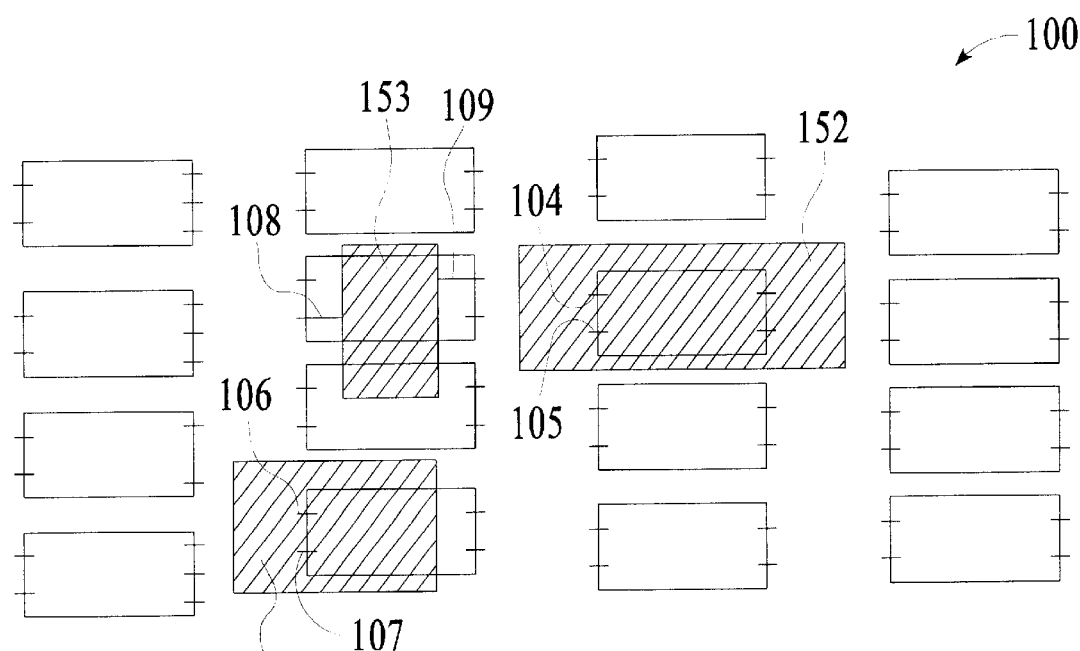
FIG. 7 is a top view of a portion of an integrated circuit layout corresponding to FIG. 6 with power cells formed in open areas of the routing space.

Thus, as shown in FIG. 7, the plate of capacitor 151 that connects to power is connected to pin 106 by utilizing a via directly from that plate to pin 106. Similarly, the plate of capacitor 151 that connects to ground is directly connected to pin 107, by simply dropping a via to pin 107. Because one of such vias would have to pass through the lower plate of the capacitor, it generally will be necessary to form a small hole in the lower plate for this purpose. Alternatively, if other metal layers are available for routing wires, it may be possible to route a connection in another way to the appropriate power and ground input pin of the corresponding cell. However, such alternative technique generally will not be preferred, as it typically will increase the routing length from the capacitor to the portion of the circuit that requires the high transient peak power, thereby partially defeating the goal of placing the power cells as close as possible to such portions of the circuit.

In a similar manner, the plates of capacitor 152 are connected to power and ground and also to the corresponding input pins 104 and 105. However, because capacitor 153 is not disposed directly above the corresponding input power pin 108 and ground pin 109, wires are routed from the plates of capacitor 153 to those pins. In the present case, this can be accomplished with a horizontal wire segment from each plate to the corresponding pin, routed primarily on the second metal layer.

FIGS. 8A and 8B illustrate electrical diagrams for the routing of power and ground to a portion of an IC in the conventional case and in the case according to the present invention, respectively. In FIGS. 8A and 8B, $V_{DD}$ 180 and $V_{SS}$ 182 supply power and ground to a load 186 which consists of one or more cells that comprise a portion of the circuit. Resistance 184 is due to the wire routing between $V_{DD}$ 180 and $V_{SS}$ 182, on the one hand, and load 186 on the other. However, as shown in FIG. 8B, in parallel with load 186 is power cell 190. Although shown as a single capacitor, power cell 190 may in fact consist of several capacitors connected in parallel. In any case, power cell 190 stores electrical power for use in supplying the transient peak power requirements of load 186.

The effects of power cell 190 are observed with reference to FIGS. 9A and 9B. Specifically, FIG. 9A illustrates a plot of voltage across load 186 versus time in the conventional case. In FIG. 9A, time points 191 and 192 correspond to the beginning and the end, respectively, of a transient peak power demand by load 186. During this time interval, the electrical current drawn by load 186 increases, resulting in an increased voltage drop across resistance 184 and a corresponding voltage decrease across load 186. As a result, the power delivered to load 186 is not as large as it otherwise would be.

This situation is contrasted with the case where on-chip power cells are used according to the present invention. This case is illustrated in FIG. 9B. As shown in FIG. 9B, the voltage across load 186 begins to drop at time point 190 even when using power cell 190. However, when this occurs power cell 190 begins discharging, thereby supplying additional current for load 186. As a result, the voltage drops more slowly in the case according to the present invention. Assuming that the capacitance of power cell 190 is significantly large and the time interval between time points 191 and 192 is sufficiently short, the voltage drop during that time interval will be acceptably small. In any case, it is apparent that the total power delivered to load 186 during the time interval between points 191 and 192 is significantly greater when using the power cell according to the present invention than is possible in the conventional case.

Design System Environment

Figure 10:
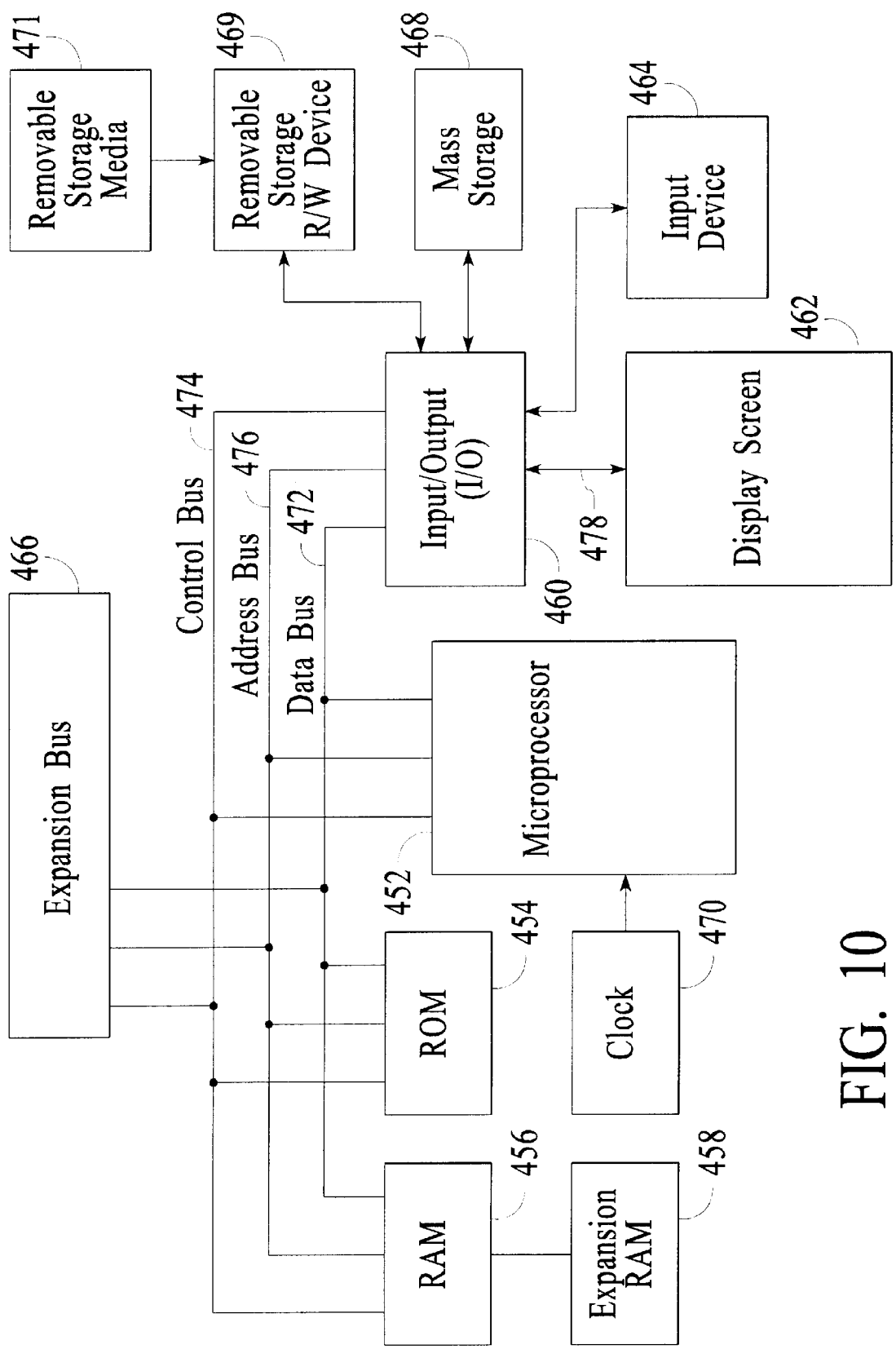
FIG. 10 is a block diagram of a general purpose computer system, representing one suitable computer platform for implementing the methods of the present invention.

Generally, the methods described herein with respect to IC design will be practiced with a general purpose computer, either with a single processor or multiple processors. FIG. 10 is a block diagram of a general purpose computer system, representing one of many suitable computer platforms for implementing the methods described above. FIG. 10 shows a general purpose computer system 450 in accordance with the present invention. As shown in FIG. 10, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform the steps of the inventive method described above, stored in ROM 454 and/or RAM 456. It is noted that such process steps may initially be stored in mass storage 468, downloaded into RAM 456 and then executed out of RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media include, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Conclusion

The present invention provides an integrated circuit having capacitors formed in the unused portions of its metal layers. Such capacitors preferably are used for satisfying the transient peak power demands of different portions of the IC. However, they may also be used for any other purpose in which a capacitance is desired. When used for satisfying transient peak power demands, such capacitors are preferably placed as close as possible to the areas of the IC that require such high transient peak power.

The sizes of the capacitors will vary depending upon how much of particular areas of the metal layers are needed for routing wires. However, the width of the plates of the capacitor (or the overlapping portion of the plates) may be at least 2, 3, 5, 10, or even more times the typical wire width used on the IC. As a result, the plates (or the overlapping portion thereof may be at least 10, 20, 40, 70, 100, or even greater square microns. Such dimensions can provide capacitors having capacitance values of at least 5, 10, 20 or even greater femtoFarads ($10^{-15}$ Farads).

The capacitors formed in this manner can be used flexibly to accommodate the requirements of the IC. For example, each capacitor may supply a single cell or a combination of cells; in particular, it may be desirable to connect a single capacitor to two or more cells having transient peak power requirements that occur at different times. Moreover, particularly where a single large area is not available, multiple such capacitors can be connected in parallel to meet the peak power demands of particular portions of circuitry. Also, a capacitors plates can be connected to each of power, ground and a cell's input pins using any desired combination of vias and wire segments.

As noted above, "transient" and "peak" are relative terms, and it is possible to trade off between supplying increased steady state power for a portion of circuitry and increasing the capacitance of the power cell (capacitor) supplying that portion of circuitry. Providing capacitors according to the present invention often can provide much more design flexibility in this regard, while at the same time achieving increased efficiency by utilizing a presently unutilized resource, i.e., unused space on the metal layers.

Thus, although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Rather, it is intended that all such variations not departing from the spirit of the invention be considered as within the scope thereof as limited solely by the claims appended hereto.

Also, several different embodiments of the present invention are described above, with each such embodiment described as including certain features. However, it is intended that the features described in connection with the discussion of any single embodiment are not limited to that embodiment, but may be included and/or arranged in various combinations in any of the other embodiments as well, as will be understood by those skilled in the art.

What is claimed is:

1. A method for supplying power and ground to locations on an integrated circuit (IC) device that has plural metal layers for routing wires and a substrate for forming electronic components, said method comprising:

(a) identifying portions of the circuit requiring high transient peak power;

(b) routing wires on the plural metal layers to create an overlap area near an area of the IC device that requires high transient peak power;

(c) identifying the overlap area where two of the plural metal layers that are adjacent to each other have open space;

(d) forming a plate in the overlap area of each of said two metal layers so as to construct a capacitor;

(e) connecting one plate of the capacitor to power and the other plate of the capacitor to ground; and (f) connecting the plates of the capacitor to locations on the substrate of the IC device that are near the area of the IC device that requires high transient peak power.

2. A method according to claim 1, wherein the plates of the capacitor are formed so as to occupy substantially all of the overlap area.

3. A method according to claim 1, wherein the plates of the capacitor have a width of at least twice the width of a typical wire on the IC device.

4. A method according to claim 3, wherein the plates of the capacitor have a width of at least three times the width of a typical wire on the IC device.

5. A method according to claim 3, wherein the plates of the capacitor have a width of at least five times the width of a typical wire on the IC device.

6. A method according to claim 1, wherein plural overlap areas exist where two of the plural metal layers that are adjacent to each other have open space, and wherein a capacitor is constructed in each of said plural overlap areas.

7. A method according to claim 1, wherein a capacitor is constructed in each area where two of the plural metal layers that are adjacent to each other have open space.

8. A method according to claim 1, further comprising a step of routing wires on the plural metal layers, wherein routing is performed so as to attempt to create a new overlap area where two of the plural metal layers that are adjacent to each other have open space near each of plural areas of the IC device that requires high transient peak power.

9. A method according to claim 8, wherein a capacitor is constructed in each new overlap area.

10. A method according to claim 1, wherein the plates of the capacitor are formed so as to occupy substantially all of the overlap area.

11. A method according to claim 1, wherein the capacitor has a capacitance of at least 5 femtofarads.

12. A method according to claim 1, wherein an overlap area of the plates of the capacitor is at least 10 square microns.

13. A computer-readable medium storing computer-executable process steps for supplying power and ground to locations on an integrated circuit (IC) device that has plural metal layers for routing wires and a substrate for forming electronic components, said process steps comprising steps to:

(a) identify portions of the circuit requiring high transient peak power;

(b) route wires on the plural metal layers to create an overlap area near an area of the IC device that requires high transient peak power;

(c) identify an overlap area where two of the plural metal layers that are adjacent to each other have open space;

(d) form a plate in the overlap area of each of said two metal layers so as to construct a capacitor;

(e) connect one plate of the capacitor to power and the other plate of the capacitor to ground; and (f) connect the plates of the capacitor to locations on the substrate of the IC device that are near the area of the IC device that requires high transient peak power.

* * * * *